United States Patent
Francis et al.

(10) Patent No.: US 10,802,475 B2
(45) Date of Patent: Oct. 13, 2020

(54) POSITIONER FOR A ROBOTIC WORKCELL

(71) Applicant: Elite Robotics, Camarillo, CA (US)

(72) Inventors: Zachary Francis, Oxnard, CA (US); Robert Kay, Thousand Oaks, CA (US)

(73) Assignee: Elite Robotics, Camarillo, CA (US)

( * ) Notice: Subject to any disclaimer, the term of this patent is extended or adjusted under 35 U.S.C. 154(b) by 114 days.

(21) Appl. No.: 16/035,909

(22) Filed: Jul. 16, 2018

(65) Prior Publication Data
US 2020/0019149 A1    Jan. 16, 2020

(51) Int. Cl.
*G05B 19/418* (2006.01)
*G01B 11/30* (2006.01)
*H01L 21/67* (2006.01)
*H01L 21/68* (2006.01)

(52) U.S. Cl.
CPC ...... *G05B 19/41815* (2013.01); *G01B 11/303* (2013.01); *G05B 19/4189* (2013.01); *G05B 19/41865* (2013.01); *H01L 21/67259* (2013.01); *H01L 21/681* (2013.01); *B65G 2203/0233* (2013.01); *B65G 2203/044* (2013.01)

(58) Field of Classification Search
CPC ........... B65G 47/24; B65G 2203/0225; B65G 2203/0233; B65G 2203/044; B65G 2811/0626; B23P 19/001; H05K 13/0812; Y10T 408/21; Y10T 408/165; Y10T 408/175; H01L 21/67259; H01L 21/68; H01L 21/681; G05B 19/41815; G05B 19/41865; G05B 19/4189
See application file for complete search history.

(56) References Cited

U.S. PATENT DOCUMENTS

| | | | | |
|---|---|---|---|---|
| 5,125,790 A * | 6/1992 | Foulke | ................ | B65G 47/912 414/590 |
| 5,559,727 A * | 9/1996 | Deley | ................ | H05K 13/0812 700/279 |
| 5,740,034 A * | 4/1998 | Saeki | ................ | H01L 21/681 700/59 |
| 5,760,893 A * | 6/1998 | Raymond | ............ | H05K 1/0269 356/237.1 |
| 6,023,336 A * | 2/2000 | Hill | ........................ | H01L 21/68 356/399 |
| 6,106,221 A * | 8/2000 | Manuszak | ............. | B23P 19/003 221/124 |
| 6,222,629 B1 * | 4/2001 | Morris | ................ | G01B 11/2433 356/601 |
| 6,996,313 B1 * | 2/2006 | Sherback | ................ | G02B 6/423 385/52 |
| 7,239,399 B2 * | 7/2007 | Duquette | ............ | H05K 13/0812 356/614 |
| 7,375,361 B2 * | 5/2008 | Turner | ................. | B25H 1/0092 250/559.29 |
| 7,495,248 B2 * | 2/2009 | Mitsui | ..................... | G01V 8/20 250/559.29 |
| 7,728,980 B2 * | 6/2010 | Namiki | ................ | G01N 21/43 356/445 |
| 7,969,567 B2 * | 6/2011 | Yoshida | ............ | G11B 20/1883 356/237.2 |

(Continued)

*Primary Examiner* — Crystal J Barnes-Bullock
(74) *Attorney, Agent, or Firm* — Blue Sky Technical Advisors (57) ABSTRACT

Methods and apparatus for the positioning of a feature of a tray such that a robot may place a component in the feature are disclosed.

14 Claims, 8 Drawing Sheets

(56) References Cited

U.S. PATENT DOCUMENTS

| | | | | |
|---|---|---|---|---|
| 8,314,371 | B2* | 11/2012 | Sorabji | H01L 21/67115 |
| | | | | 219/446.1 |
| 8,422,343 | B2* | 4/2013 | Yamada | G11B 7/0935 |
| | | | | 369/44.15 |
| 9,020,878 | B2* | 4/2015 | Kush | G01N 21/91 |
| | | | | 706/50 |
| 9,610,892 | B1* | 4/2017 | Salter | H05B 37/0227 |
| 10,047,918 | B2* | 8/2018 | Su | F21V 9/38 |
| 10,173,246 | B1* | 1/2019 | Putman | B07C 7/005 |
| 10,310,157 | B2* | 6/2019 | Rasmussen | G02B 6/0008 |
| 2001/0019104 | A1* | 9/2001 | Ohkawa | G06K 7/10693 |
| | | | | 250/234 |
| 2001/0055069 | A1* | 12/2001 | Hudson | H05K 13/0812 |
| | | | | 348/302 |
| 2002/0124399 | A1* | 9/2002 | Ogimoto | H01L 21/681 |
| | | | | 29/833 |
| 2005/0252454 | A1* | 11/2005 | Parkhe | H01L 21/6831 |
| | | | | 118/729 |
| 2011/0089346 | A1* | 4/2011 | Tsuruta | B82Y 10/00 |
| | | | | 250/492.22 |
| 2013/0284707 | A1* | 10/2013 | Kusakabe | B23K 1/018 |
| | | | | 219/85.13 |
| 2018/0006011 | A1* | 1/2018 | Ninan | G02F 1/134309 |
| 2018/0259458 | A1* | 9/2018 | Hell | G01N 21/6458 |
| 2019/0154438 | A1* | 5/2019 | Qi | B65G 47/24 |
| 2019/0189307 | A1* | 6/2019 | Mehrotra | G05B 19/042 |

* cited by examiner

Figure 3E
(detail "A" of Fig. 3D)

POSITIONER FOR A ROBOTIC WORKCELL

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

Field

The present invention generally relates to positioning a feature in a precise location to allow a robot to place a component in the feature.

Description of the Related Art

Processing equipment typically requires parts to be supplied at a defined location in a defined orientation in order to be utilized by the equipment. For example, a simple cam-driven corker, which inserts corks into wine bottles after filling, requires the corks and bottles to be provided in specific locations for the process to function.

Pick-and-place machines are commonly used to place small components on assemblies. For example, printed circuit board assemblies (PCBAs) are commonly loaded with the integrated circuits (ICs) and analog components before soldering all of the placed components to the board in a wave-soldering machine. The ICs and other components are provided to the pick-an-place equipment in known feed locations.

Tape-and-reel is a known technique for providing components to a pick-and-place machine. The components are affixed to a tape substrate at intervals. The tape is then wound onto a reel that can be mounted onto a feeder that advances the tape until the next part is in the desired feed location. One drawback is that a significant effort is required to place components on a tape and many parts are only used in small quantities that do not justify the expense to provide them on reels.

Another method of providing parts to a pick-and-place machine is to provide the parts in trays wherein the parts are arranged in a pattern on a planar surface. This method is suitable for providing parts not available on tape-and-reel, yet has its own drawback of requiring the parts to be loaded onto the tray, often by hand.

SUMMARY

What is needed is a simple and adaptable method of loading a plurality of components into a respective plurality of receptacles on a tray or other substrate such that a pick-and-place machine can remove the components individually to be placed on the PCBA. The invention described herein fulfills this need.

In an aspect, the present disclosure provides for, and includes, an apparatus for positioning a feature of a tray. The apparatus includes a first source configured to emit a first type of light to illuminate a first region of a surface of the tray, a first detector coupled to the source and configured to sense the first type of light reflected from the surface of the tray and provide a first signal comprising information about the sensed first type of light, and an actuator coupled to the source and to the tray and configured to cause the tray to move relative to the source upon receipt of a command. The apparatus also includes a processor coupled to the actuator and the detector and configured to receive the first signal and send the command, and a memory coupled to the processor and comprising instructions that, when executed on the processor, cause the processor to evaluate a magnitude of the first type of sensed light, determine the location of the feature relative to a designated location based on the magnitude of the first type of sensed light, and cause the actuator to move the tray so as to move the feature toward the designated location.

In an aspect, the present disclosure provides for, and includes, a method of positioning a hole in a tray, comprising the steps of illuminating a first region of a surface of the tray with light, sensing the light that is reflected from the surface, moving the tray until the hole enters the first region, whereupon a portion of the light passes into the hole and is not reflected,
evaluating a total energy of the sensed light, and moving the tray based on the total energy of the sensed light until the hole is at a designated location.

In an aspect, the present disclosure provides for, and includes, a method of positioning a hole in a tray that includes the steps of sensing light that is reflected from a surface of the tray, and moving the tray until a total energy of the sensed light is reduced to a local minimum.

BRIEF DESCRIPTION OF THE DRAWINGS

Aspects of the disclosure are herein described, by way of example only, with reference to the accompanying drawings. With specific reference now to the drawings in detail, it is stressed that the particulars shown are by way of example and are for purposes of illustrative discussion of aspects of the disclosure. The description and the drawings, considered alone and together, make apparent to those skilled in the art how aspects of the disclosure may be practiced.

DETAILED DESCRIPTION

This description is not intended to be a detailed catalog of all the different ways in which the disclosure may be implemented, or all the features that may be added to the instant disclosure. For example, features illustrated with respect to one embodiment may be incorporated into other embodiment, and features illustrated with respect to a particular embodiment may be deleted from that embodiment. Thus, the disclosure contemplates that in some embodiments of the disclosure, any feature or combination of features set forth herein can be excluded or omitted. In addition, numerous variations and additions to the various embodiments suggested herein will be apparent to those skilled in the art in light of the instant disclosure, which do not depart from the instant disclosure. In other instances, well-known structures, interfaces, and processes have not been shown in detail in order not to unnecessarily obscure the invention. It is intended that no part of this specification be construed to effect a disavowal of any part of the full scope of the invention. Hence, the following descriptions are intended to illustrate some particular embodiments of the disclosure, and not to exhaustively specify all permutations, combinations and variations thereof.

Unless otherwise defined herein, all technical and scientific terms used herein have the same meaning as commonly understood by one of ordinary skill in the art to which this disclosure belongs. The terminology used in the description of the disclosure herein is for the purpose of describing particular aspects or embodiments only and is not intended to be limiting of the disclosure.

All publications, patent applications, patents and other references cited herein are incorporated by reference in their entireties for the teachings relevant to the sentence and/or paragraph in which the reference is presented. References to techniques employed herein are intended to refer to the techniques as commonly understood in the art, including variations on those techniques or substitutions of equivalent techniques that would be apparent to one of skill in the art.

Unless the context indicates otherwise, it is specifically intended that the various features of the disclosure described herein can be used in any combination. Moreover, the present disclosure also contemplates that in some embodiments of the disclosure, any feature or combination of features set forth herein can be excluded or omitted.

The methods disclosed herein include and comprise one or more steps or actions for achieving the described method. The method steps and/or actions may be interchanged with one another without departing from the scope of the present disclosure. In other words, unless a specific order of steps or actions is required for proper operation of the embodiment, the order and/or use of specific steps and/or actions may be modified without departing from the scope of the present disclosure.

As used in the description of the disclosure and the appended claims, the singular forms "a," "an" and "the" and the like are intended to include the plural forms as well, unless the context clearly indicates otherwise.

As used herein, "and/or" refers to and encompasses any and all possible combinations of one or more of the associated listed items, as well as the lack of combinations when interpreted in the alternative ("or").

The terms "about" and "approximately" as used herein when referring to a measurable value such as a length, a frequency, or a position and the like, is meant to encompass variations of ±20%, ±10%, ±5%, ±1%, ±0.5%, or even ±0.1% of the specified amount.

As used herein, phrases such as "between X and Y" and "between about X and Y" should be interpreted to include X and Y. As used herein, phrases such as "between about X and Y" mean "between about X and about Y" and phrases such as "from about X to Y" mean "from about X to about Y."

As used herein, the term "component" is intended to include any product that can be provided in loose, bulk quantities. This specifically includes nails of all sizes, threaded fasteners, pins with and without heads, axially symmetric bodies of any aspect ratio, and articles having a defined but arbitrary form.

As used herein, the term "constant" means a value of a parameter that changes less than an amount that would affect the common function or usage of an object or system associated with the parameter.

As used herein, the term "light" means electromagnetic energy having a wavelength within the range of 1 picometer to 1 meter. In certain embodiments, this range is preferably 1 nanometer to 1 millimeter. In certain embodiments, this range is preferably 10-390 nanometers, which is commonly understood to be "ultraviolet" light. In certain embodiments, this range is preferably 390-700 nanometers, which is commonly understood to be "visible" light. In certain embodiments, this range is preferably 700 nanometers to 1 millimeter, which is commonly understood to be "infrared" radiation. In certain embodiments, light is polarized. In certain embodiments, light is monochromatic. In certain embodiments, light is coherent.

As used herein, the phrase "spatial intensity" means power per unit area as determined at a point within a region. The spatial intensity may vary over the region in an arbitrary fashion. In certain embodiments, the spatial intensity has a two-dimensional gaussian distribution when the spatial intensity is plotted as a third axis over the two-dimensional area.

As used herein, the term "tray" includes all objects configured to receive components at one or more designated locations. In certain embodiments, a tray is a planar object. In certain embodiments, a tray is a rigid object. In certain embodiments, trays are rectilinear in width and length with a height or thickness that is a small fraction. In certain embodiments, a tray comprises a plurality of holes or other receptacles suitable to receive a component. In certain embodiments, a tray comprises a flexible tape or flexible formed substrate. In certain embodiments, a tray comprises adhesive or other attachment mechanism to retain a component placed on the tray.

As used herein, the term "feature" includes holes of both circular and arbitrary profile, receptacles of arbitrary shape, threaded and unthreaded recesses, retention mechanisms, snap-fit retainers, pins, threaded studs, protrusions of any form, and other shaped departures from a planar surface. A feature may be any arbitrary form suited to the specific application of a specific embodiment, e.g. a specific component. As used herein, the term "feature" is considered interchangeable and equivalent to the terms "hole" or "receptacle."

As used herein, the term "method" comprises a set of activities, e.g. steps in a process. In certain embodiments, the steps must be performed in a particular order while, in other embodiments, the sequence of activities may be interchanged. The term "method" is considered equivalent to and interchangeable with "process." In certain embodiments, one or more disclosed steps are omitted.

Figure 1A:
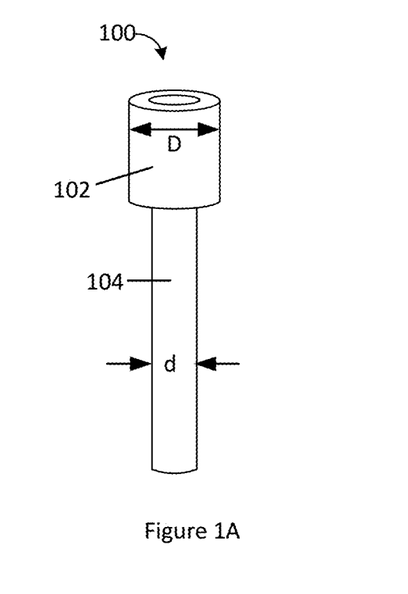
FIGS. 1A & 1B depicts an exemplary component used in the construction of a PCBA.
Figure 1B:
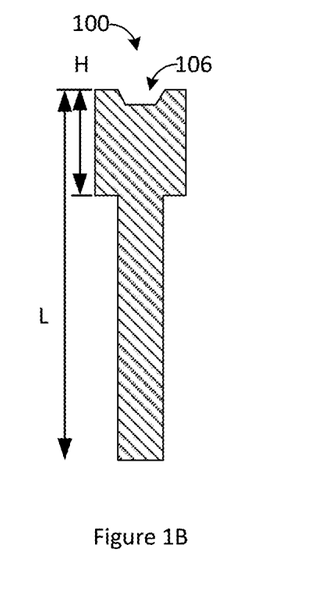

FIGS. 1A & 1B depict an exemplary component 100 used in the construction of a PCBA (not shown). FIG. 1A is a perspective view while FIG. 1B is a cross-section of the same example component 100. This example component has a shaft 104 with a diameter "d" and a head 102 with a diameter "D" that is greater than diameter "d." The head 102 has a height "H" while component 100 has an overall length "L."

In certain embodiments, the component 100 has a recess 106 formed in the head 102. In the example of FIGS. 1A-1B, the recess 106 is round with tapered sides and a flat bottom. In other embodiments, this recess 106 may be any of a hex receptacle, a Philips head receptacle, a star receptacle, ora slot, or other feature. In certain embodiments, the component 100 lacks a recess 106. In certain embodiments, the shaft 104 and head 102 are smooth while in other embodiments, one or both of the shaft 104 and head 106 are one of threaded, knurled, grooved, or otherwise formed. The invention described herein is suitable for handling components having any one or more of these features.

Figure 1C:
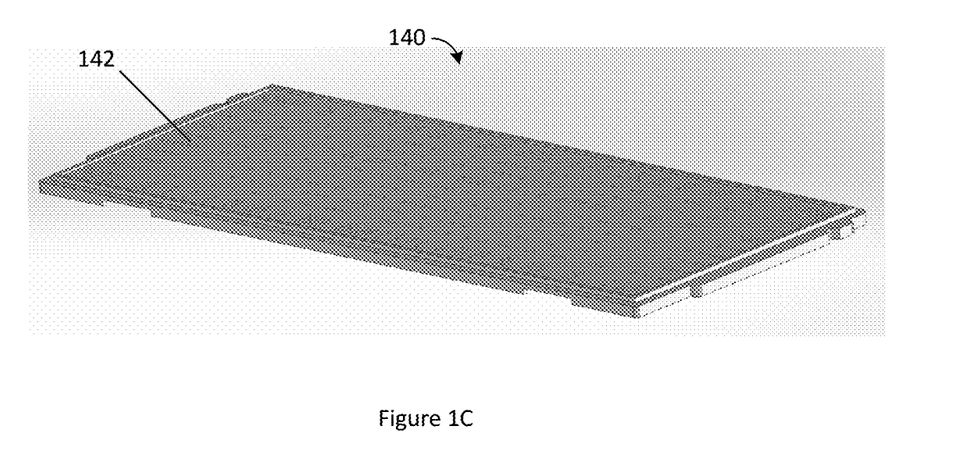
FIG. 1C depicts an exemplary tray for providing a plurality of components to a pick-and-place machine.

FIG. 10 depicts an exemplary tray 140 for providing a plurality of components to a pick-and-place machine. In this example, the tray is rectangular with a rectilinear array of 2805 holes 142. The tray 140 comprises features suitable for alignment of the tray 140 to a holding fixture (not shown).

Figure 2A:
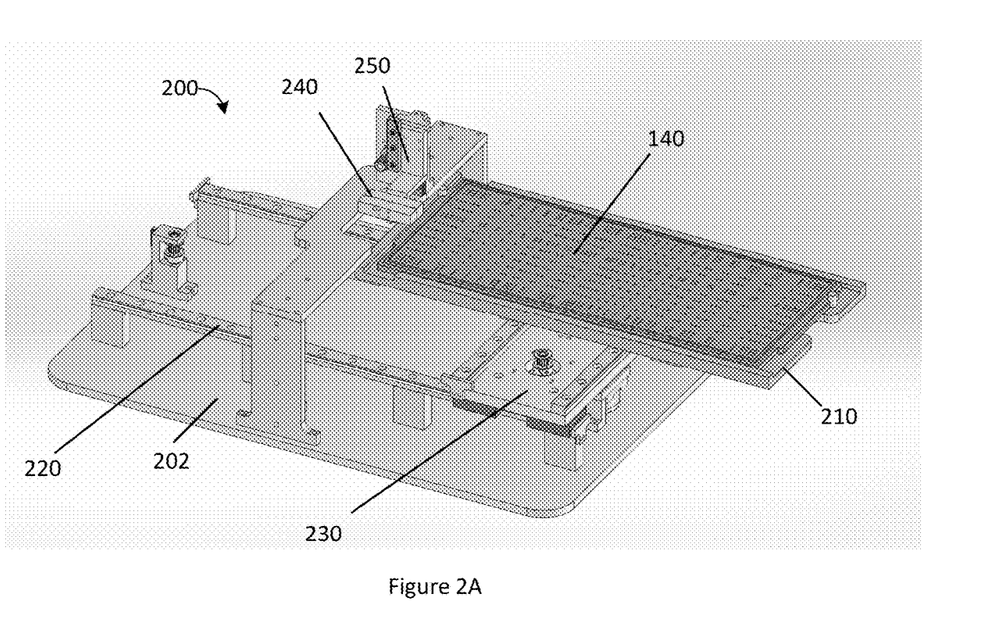
FIGS. 2A-2B depict an exemplary positioning system, according to certain aspects of the present disclosure.
Figure 2B:
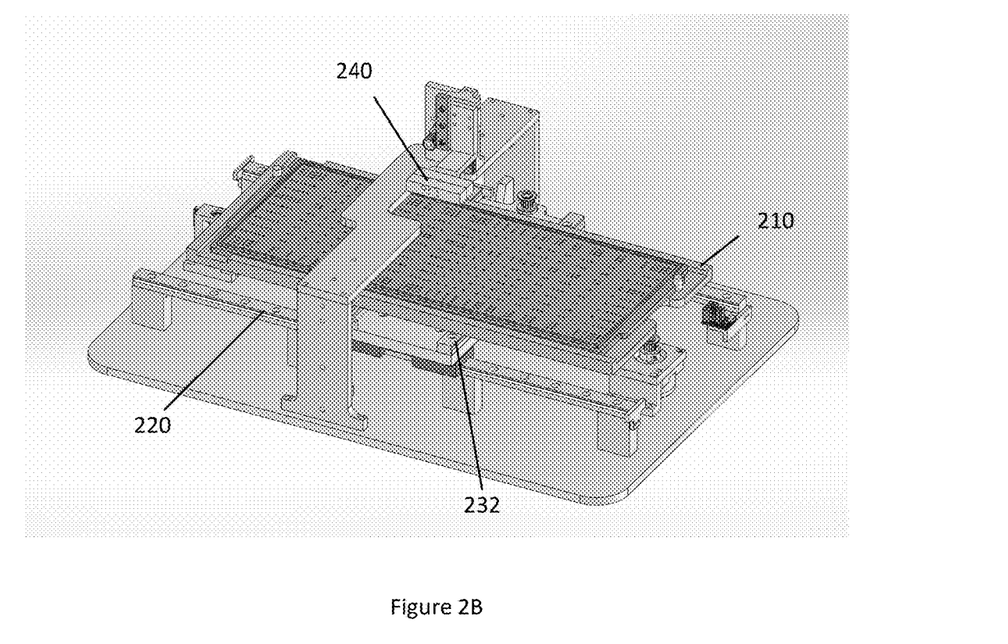

FIGS. 2A-2B depict an exemplary positioning system 200, according to certain aspects of the present disclosure. A tray 140 is positioned on a carrier 210. A placement device 240 is mounted on a vertical carrier 250 that moves perpendicular to the plane of the surface of tray 140. The carrier 210 is configured to move along a first axis relative to stage 230, which in turn is configured to move along a second axis relative to stage 220. The stage 220 is mounted to a base 202. In this example, the first and second axes are perpendicular. In other configurations, the carrier 210 and stage 230 move in arbitrary directions. In other configurations, the axes comprise curved paths and carrier 210 and stage 230 move along these curved paths. In certain embodiments, the first and second stages are replaced with a robot arm or other mechanism having multiple degrees-of-freedom that enable any point of tray 140 to be placed under the placement fixture 240.

FIG. 2A depicts the system 200 in a first position wherein the placement fixture 140 is generally over a lower left, in the view of FIG. 2A, corner of tray 140. FIG. 2B depicts the same system 200 in a second position wherein the placement fixture 140 is generally over a center of tray 140.

Figure 3A:
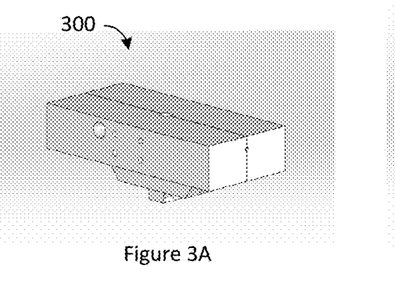
FIGS. 3A-3D depict an exemplary placement fixture, according to certain aspects of the present disclosure.
Figure 3B:
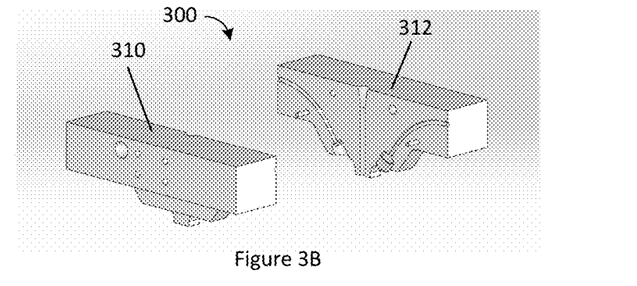

FIG. 3A depicts an exemplary placement fixture 300, according to certain aspects of the present disclosure. FIG. 3B depicts the two halves 310, 312 of fixture 300 separated. In certain embodiments, the two halves 310,312 are mirror images of each other.

Figure 3C:
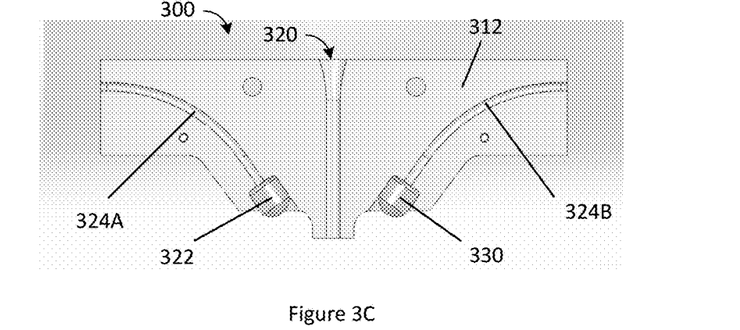

FIG. 3C is a front view of fixture half 312. Channel 320 is a path for feeding a component into a hole in a tray. In this example, channel 320 is round in cross-section with an outward flare at the top end. In other embodiments, the flared portion is one of a straight conical shape, a stepped countersink, a shaped cone with a curved surface, or absent entirely.

The placement fixture 300 comprises a source 322 and a detector 330. In certain embodiments, these devices are located as indicated in FIG. 3C with communication wires (not shown) running through channels 324A and 324B from a processor (not shown).

In certain embodiments, a fiber optic cable (not shown) runs through channel 324A and source 322 is an optical device configured to accept light from the fiber optic cable and project a beam of light. Additional details of the projected light are provided in FIGS. 5A-5B. An external light emitter (not shown), for example a Light Emitting Diode (LED), is coupled to the fiber optic cable to provide the light. In certain embodiments, the light is provided by an incandescent source, a fluorescent source, a laser, or other light-emitting device. The external light emitter is coupled to the processor so as to control one or more of switching the light on and off, the light frequency, and the light intensity.

In certain embodiments, a fiber optic cable (not shown) runs through channel 324B and detector 330 is an optical device configured to accept light within a field-of-view and couple this light into the fiber optic cable. Additional details of the field-of-view are provided in FIGS. 5A-5B. An external detector (not shown), is coupled to the fiber optic cable. In certain embodiments, the detector 330, either in situ as shown in FIG. 3C or positioned remotely and coupled to an optical element through a fiber optic cable, is one of a photon detector or multitude of detectors, a thermal detector, or an imaging device such as a camera or Charged Coupled Device (CCD). In certain embodiments, the detector 300 determines the total energy of the received light. In certain embodiments, the detector 300 determines a centroid of the spatial intensity of the received light. In certain embodiments, the detector 300 captures an image of the illuminated region of the surface of the tray.

Figure 3D:
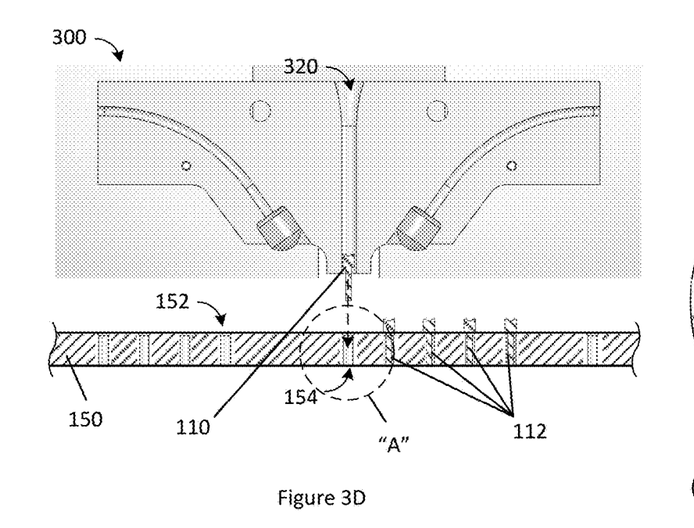

FIG. 3D is a front view of fixture half 312 positioned over a tray 150 that has a plurality of holes 152. In FIG. 3D, an example component 110 has been dropped into the top of channel 320 and is in the process of exiting the bottom of channel 320 and dropping into hole 154 that is located below channel 320. In this example, the holes 152 have a diameter that is greater than the body of component 110, which is generally of the shape shown in FIGS. 1A & 1B, and less than the diameter of the head of component 110 such that the head of component 110 rests on the surface of tray 150. Components 112 are shown as accepted into their respective holes 152.

Figure 3E:
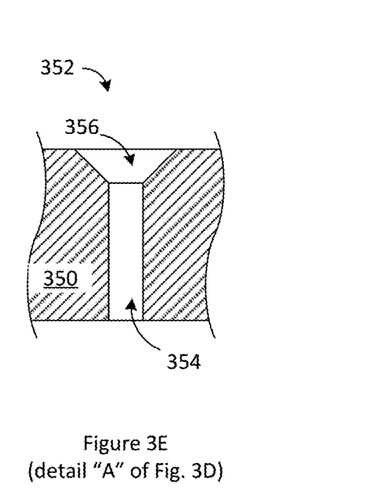
FIG. 3E is an enlarged view of detail "A" of FIG. 3D, according to certain aspects of the present disclosure.

FIG. 3E is an enlarged view of detail "A" of FIG. 3D, according to certain aspects of the present disclosure. Part of this invention is the shape and size of the hole 352 in the tray 350. The hole 352 has a positioning feature 354 that, in this example, is a straight circular hole. In certain embodiments, this positioning feature may have an arbitrary shape or form and may include solid aspects such as a locating pin or shaped recess matched to a component. The hole 352 also has a receiving feature 356 disposed at the point where the component will enter the hole 352. The receiving feature 356 is chosen to ensure that the component will reliably go into the positioning feature 354 and remain in the positioning feature 354 regardless of the velocity with which the component enters the hole 352. In certain embodiments, the receiving feature 356 is a right symmetric cone as depicted in FIG. 3E. In certain embodiments, the receiving feature 356 has one or more of a step, a cylindrical portion, two angled portions with different angles, or other arbitrary shape or profile. In certain embodiments the receiving feature 365 or the positioning feature 354 include a retention feature such as a flexible element (not shown) angled downward and positioned so as to engage a portion of the component after the component enters the hole 352. In certain embodiments, the positioning feature 354 comprises a retention feature, for example a magnet (not shown) positioned at the bottom of positioning feature 354.

Figure 4A:
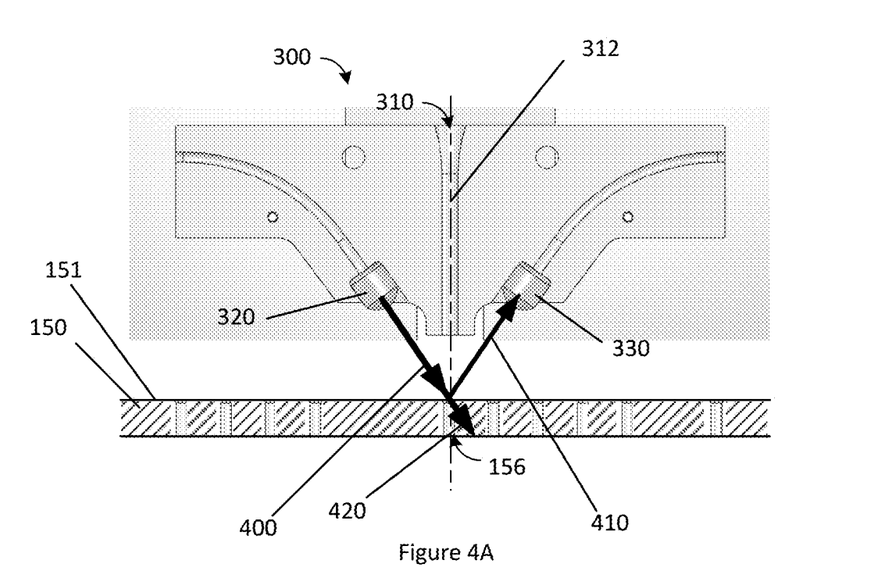
FIGS. 4A-4B illustrate the position sensing aspect of the placement fixture of FIG. 3A-3D, according to certain aspects of the present disclosure.
Figure 4B:
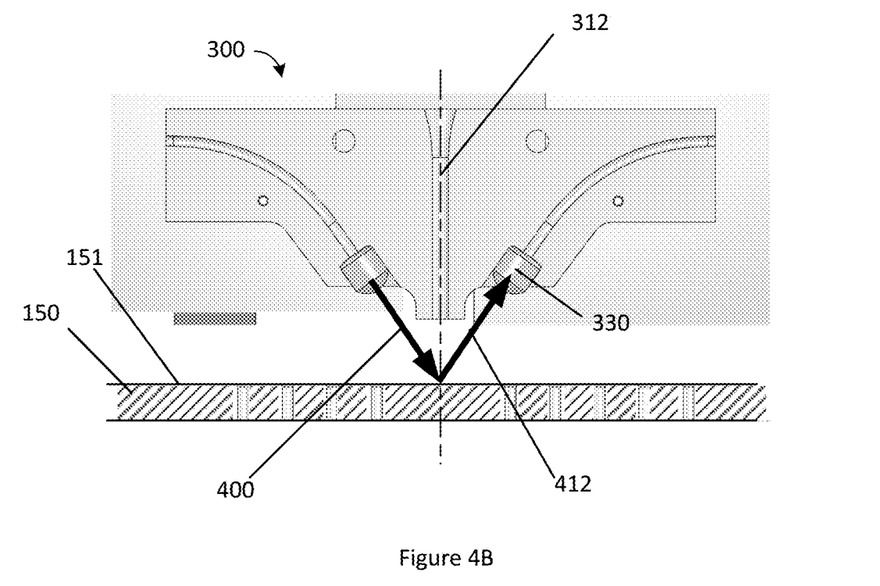

FIGS. 4A-4B illustrate the position sensing aspect of the placement fixture 300 of FIG. 3A-3D, according to certain aspects of the present disclosure. The centerline 312 of channel 310 is aligned with a centerline of hole 156 in tray 150. The source 320 projects a beam of light 400 at a first angle of incidence. In the configuration of FIG. 4A, a portion 420 of this light passes into the top opening of hole 156 and is reflected downward into the hole 156. The remaining portion 410 of the light of beam 400 is reflected from surface 151 at a second angle of incidence toward detector 330, wherein the second angle of incidence is the complement to the first angle, i.e. the same magnitude of angle in the opposite direction.

In FIG. 4B, the tray 150 has been displaced laterally such that the centerline 312 is positioned over a featureless portion of surface 151. Almost all of the projected beam 400 is reflected as beam 412 toward detector 330, with a portion of the incident light of beam 400 absorbed by the surface 151 or reflected in a diffuse manner.

Figure 5A:
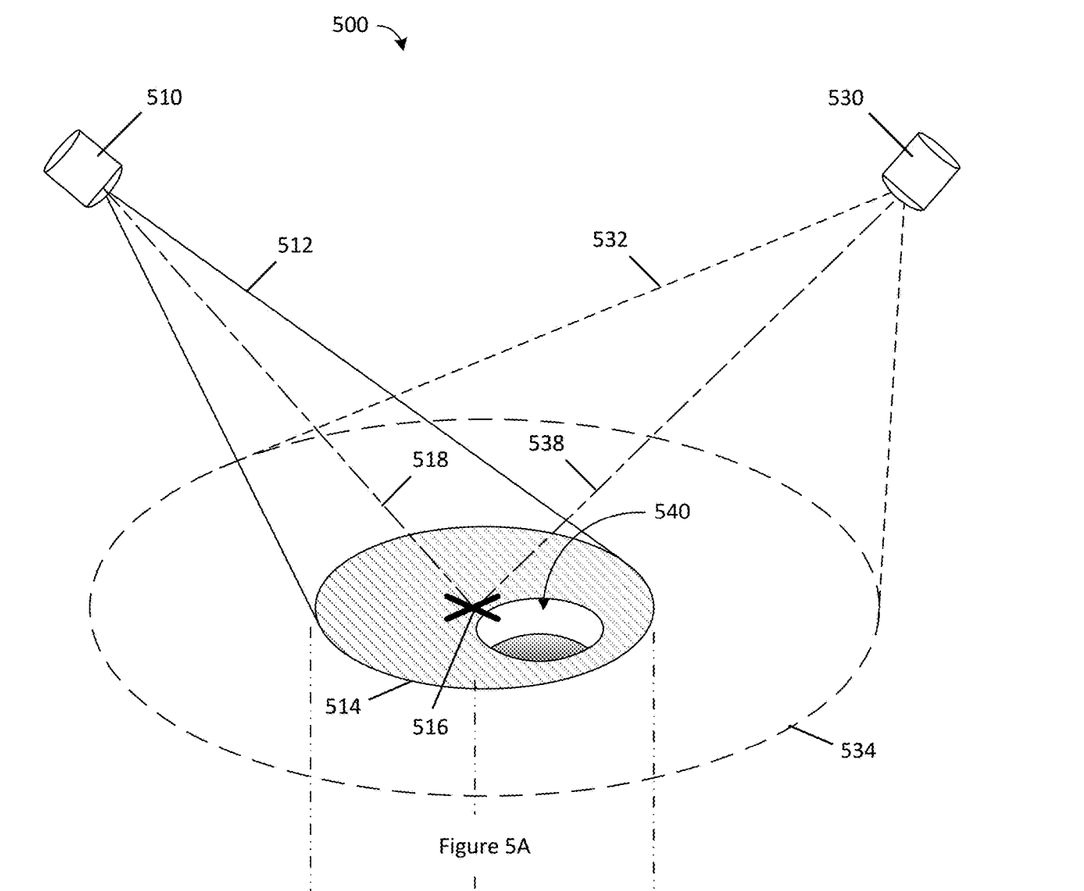
FIGS. 5A-5B depict the functions of various elements of an example positioner, according to certain aspects of the present disclosure.
Figure 5B:
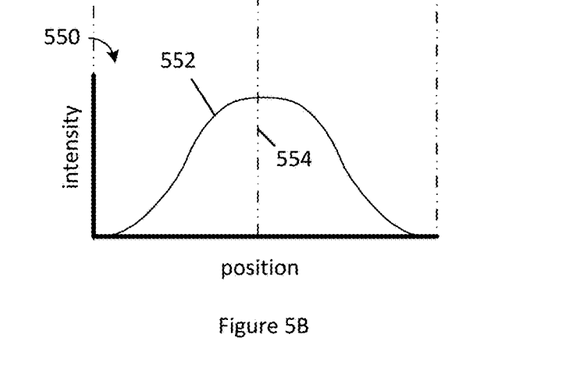

FIGS. 5A-5B depict the functions of various elements of an example positioner, such as position 200 of FIG. 2A, according to certain aspects of the present disclosure. In FIG. 5A, the source 510 projects a beam of light 512 that illuminates a first region 514 on the surface of a tray. In this example, the region 514 has a diameter that is several times larger than the diameter of hole 540. The first region has a designated location 516 that, in this example, is the location to which the hole 540 is to be moved. In certain embodiments, the designated location 516 is at a center of the illuminated region 514. A detector 530 has a field-of-view 532 that observes a second region 534 that, in this example, is larger than the illuminated first region 514.

In certain embodiments, the beam of light 512 has a first centerline 518 and the field-of-view 532 has a second centerline 538. In certain embodiments, the centerlines 518 & 538 lie in a common plane that is perpendicular to the surface of the tray. In certain embodiments, the centerlines 518 & 538 intersect a common point on the surface of the tray. In certain embodiments, the common point is the center 516 of the illuminated region 514.

FIG. 5B depicts an example plot 550 of the spatial intensity 552 of the light incident upon surface 151 within the first region 514, taken along a section line running through the center 516 of the region 514. In certain embodiments, the spatial intensity 552 is greater in the center than at the periphery of the illuminated area 514. In certain embodiments, the spatial intensity 552 is generally gaussian in shape. In certain embodiments, the highest intensity is at a location coincident with the center 516. In certain embodiments, the spatial intensity 552 is approximately uniform. In certain embodiments, the spatial intensity 552 has one of an approximately linear gradient across the region 514, a value that changes monotonically across the region 514, and a symmetric arbitrary shape.

Figure 8:
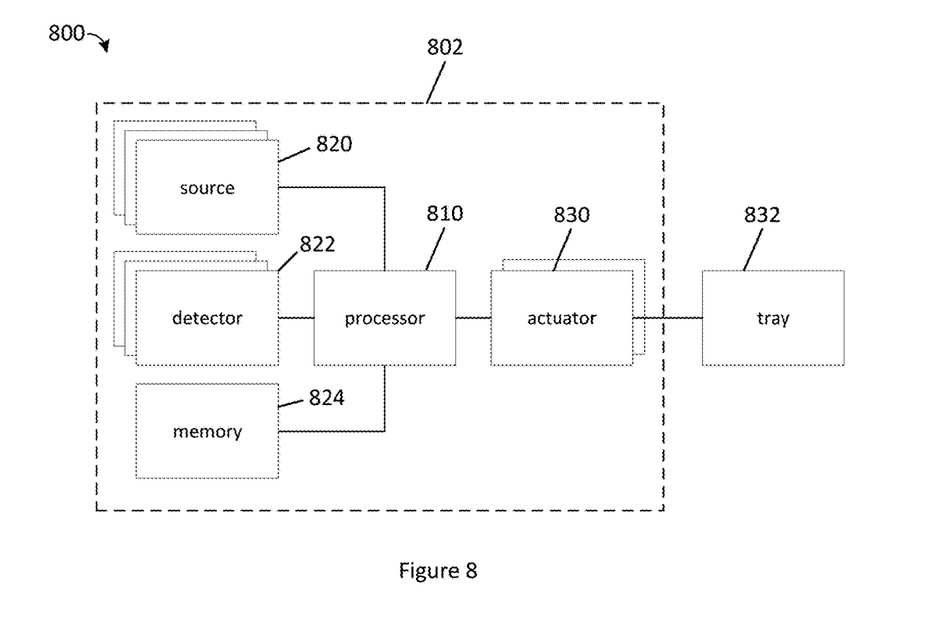
FIG. 8 is a block diagram of an exemplary system, according to certain aspects of the present disclosure.

A processor, such as processor 810 of FIG. 8, receiving information comprising the intensity of the sensed light can determine the location of the feature, e.g. the hole 540, relative to a designated location, e.g. center 516 by comparing the intensity to information about the shape and magnitude of the curve 552 that is stored in a memory, such as memory 824 of FIG. 8, that is coupled to the processor.

Figure 5C:
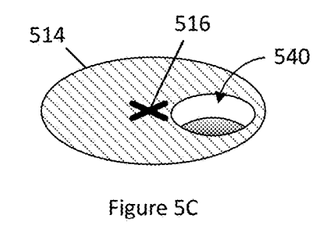
FIGS. 5C-5P illustrate how the example positioner of FIGS. 5A-5B determines when the tray is properly positioned, according to certain aspects of the present disclosure.
Figure 5D:
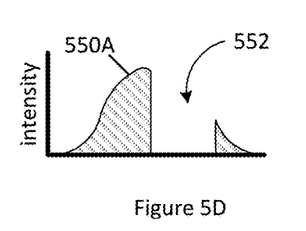
Figure 5E:
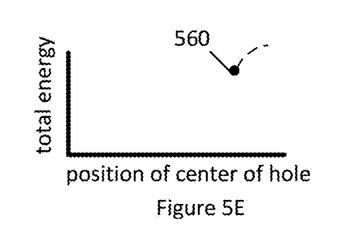
Figure 5F:
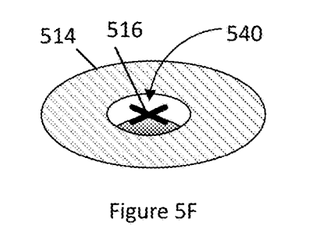
Figure 5G:
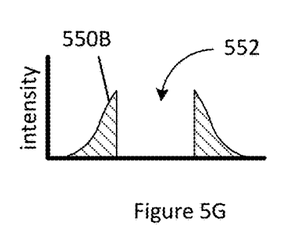
Figure 5H:
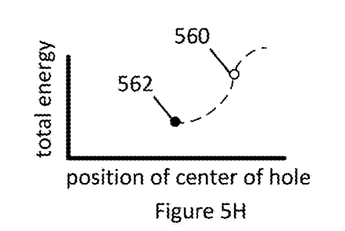
Figure 5J:
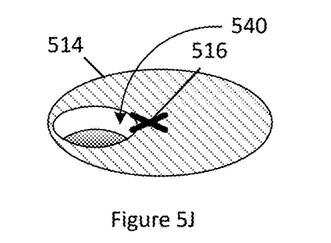
Figure 5K:
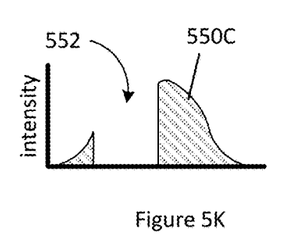
Figure 5L:
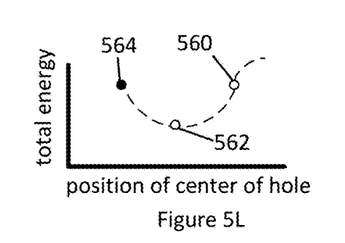
Figure 5M:
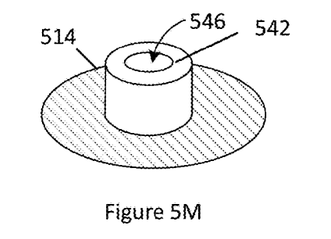
Figure 5N:
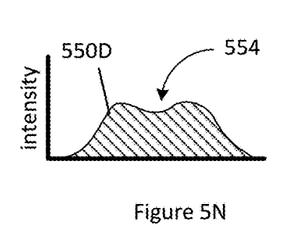
Figure 5P:
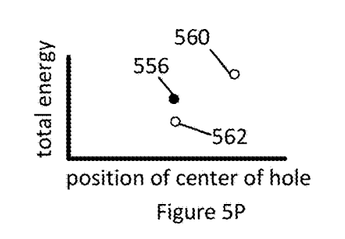

FIGS. 5C-5P illustrate how the example positioner of FIGS. 5A-5B determines when the tray is properly positioned, according to certain aspects of the present disclosure. FIGS. 5C, 5F, and 5J depicts incremental movements of a tray such that hole 540 is moving across the illuminated region 514. FIGS. 5D, 5G, and 5K depict the corresponding spatial intensities corresponding to the positions of FIGS. 5C, 5F, and 5J. The gaps 552 indicate the absence of reflected light from the hole 540, with reference to the discussion of FIGS. 4A & 4B. FIGS. 5E, 5H, and 5L depict the total energy of the reflected light at each of the respective positions of FIGS. 5C, 5F, and 5J, wherein black circles indicate the energy of the current location and white circles indicate the energies of prior positions, with the path of the energy between the depicted positions shown as dashed lines.

FIG. 5C depicts the configuration of the system 200 when the hole is within the illuminated region 514 and offset from the center 516 of the region 514. FIG. 5D depicts the spatial intensity along a line across the region 514, with a dropout 552 corresponding to the location of the hole 540 and the associated loss of reflection in that portion of region 514. Circle 560 of FIG. 5E indicates the total energy of the reflected light in the configuration of FIG. 5C.

FIG. 5F depicts the configuration of the system 200 when the hole 540 is centered on center 516 of the region 514. FIG. 5G depicts the spatial intensity along a line across the region 514, with a dropout 552 in the center of the spatial intensity 550B corresponding to the location of the hole 540 and the associated loss of reflection in that portion of region 514. Circle 562 of FIG. 5H indicates the total energy of the reflected light in the configuration of FIG. 5F, with the white circle 560 repeating the value of FIG. 5E.

FIG. 5J depicts the configuration of the system 200 when the hole 540 has passed the center 516 of the region 514. FIG. 5G depicts the spatial intensity along a line across the region 514, with a dropout 552 in the left side of the spatial intensity 550B corresponding to the location of the hole 540 and the associated loss of reflection in that portion of region 514. Circle 564 of FIG. 5L indicates the total energy of the reflected light in the configuration of FIG. 5J, with the white circles 560 & 562 repeating the values of FIGS. 5E & 5H.

FIG. 3M depicts a component 542 accepted into the hole 540 (not visible in FIG. 5M). In FIG. 5N, the recess 546 diffuses a portion of the projected light and reduces the amount of reflected light, resulting in the "dimple," i.e. a local minimum, in the top of the spatial intensity 550D as the component 542 passes through the center of region 514. In FIG. 5P, circle 556 indicates the energy of the reflected light when the component 546 is centered on location 516 of region 514. The energy level 556 is higher than the energy 562 when the hole is empty and centered at location 516.

Figure 6A:
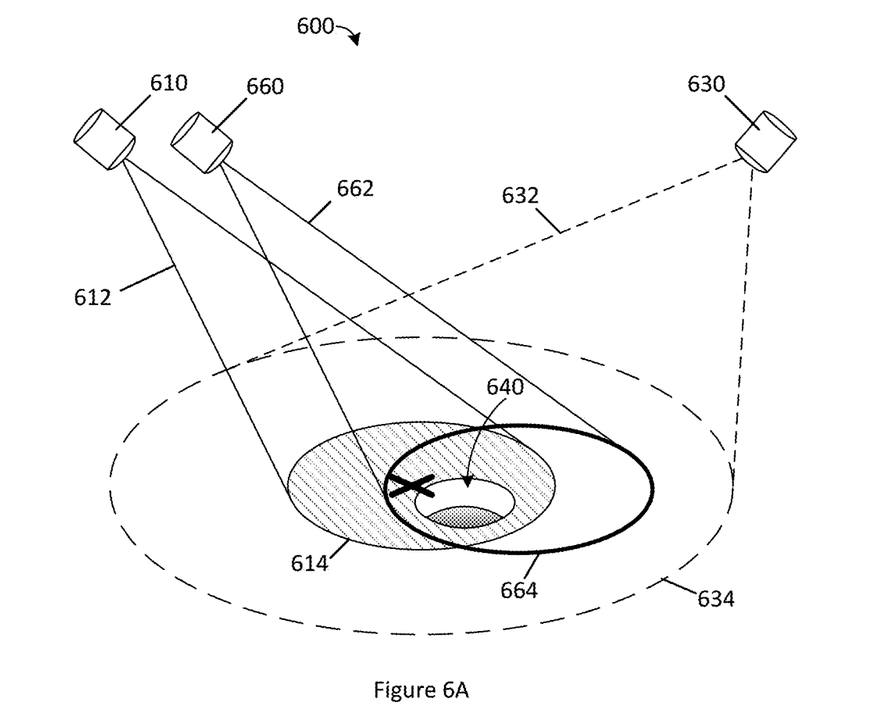
FIGS. 6A-6B depict another embodiment of a placement system, according to certain aspects of the present disclosure.
Figure 6B:
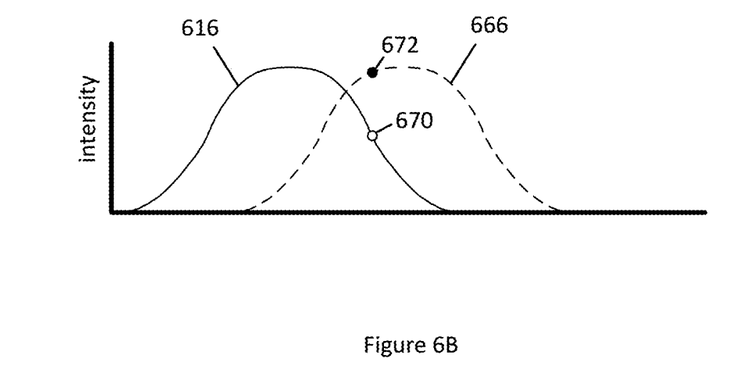

FIGS. 6A-6B depict another embodiment of a placement system 600, according to certain aspects of the present disclosure. In this example, there are two sources 610 and 660 and a single detector 630. In certain embodiments, there is a first plurality of sources and a second plurality of detectors. In certain embodiments, the sources 610 and 660 are identical in beam formation and light characteristics. In certain embodiments, the sources 610 and 660 are different in one or more of beam patterns, angles of incidence upon the tray surface, directions of incidence upon the tray surface, light frequencies, light intensities.

In certain embodiments, the light emitted from one source is polarized. In certain embodiments, the light from a first source has a first polarization, for example horizontal linear polarization, and the light from the second source has a second polarization, for example vertical linear polarization. In certain embodiments, a source comprises a polarizing filter such that the light is initially unpolarized light and then passes through the filter such that the emitted beam of light comprises only polarized light.

In certain embodiments, the detector 630 comprises a polarizing element, for example a transmissive filter, such that the detector 630 senses only light having a polarization that matches the polarization of the filter. In certain embodiments, source 610 emits light having a first polarization and illuminates region 614 and detector 630 senses only light having the first polarization while source 660 emits light having a second polarization and illuminates the same region 614 and a second detector (not shown) senses only light having the second polarization.

In certain embodiments, the sources 610 and 660 project light at the same time. In certain embodiments, the sources 610 and 660 project light at different times. In certain embodiments, there are multiple detectors 630 and multiple sources 610, wherein each detector 630 is configured to detect the reflected light from only one of the sources 610, for example by having each source 610 project a different frequency of light and use of a filter in each detector 630 that passes only frequency of light from a respective source.

Use of two sources 610 and 630 provides two total energy readings by detector 630, indicated by curves 616 and 666 for sources 610 and 660, respectively. In this example, circle 670 in FIG. 6B is the total energy associated with the light projected by source 610 and circle 672 is the total energy associated with the light projected by source 660. A processor receiving information about the total energies of the reflected light from sources 610 and 660 can unambiguously determine the location of the hole 640 within region 614.

In certain embodiments, a pair of source and detector are provided in a direction that is not coincident with a first axis along which sources 610, 660 and detector 630 are positioned, e.g. at right angles to the first axis. This additional information enables determination of the position of hole 640 in two dimensions. When combined with two actuators that move the tray in different directions, as shown in FIGS. 2A-2B, this enables placement of the hole in a desired location throughout a 2D plane.

Figures 7A, 7B:
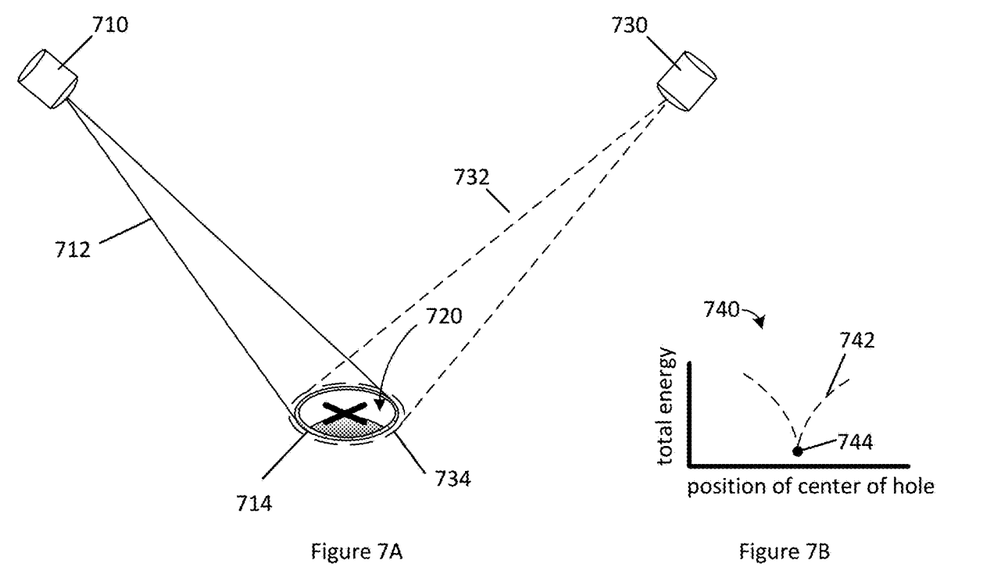
FIGS. 7A-7B depict another embodiment of a placement system, according to certain aspects of the present disclosure.

FIG. 7A depicts another embodiment of a placement system 700, according to certain aspects of the present disclosure. In this embodiment, source 710 projects a beam 712 that illuminates region 714 that is approximately the same size as the top opening of hole 720. A detector 730 captures light within a field-of-view 732 reflected from a region 734 that, in this example, is approximately the same size as the illuminated region 714. In certain embodiments, the observed region 734 is smaller than the illuminated region 714.

FIG. 7B is a plot 740 that conceptually illustrates the change in shape of the total energy curve 742 when the illuminated region 714 is approximately the same as the size of hole 720. The circle 744 is the total energy of the reflected light when the hole is centered in the illuminated region 714 and, in this example, is very close to zero. The path 742 of the total energy as the hole approaches and departs the center may be very nonlinear and steep.

FIG. 8 is a block diagram 800 of an exemplary system 802, according to certain aspects of the present disclosure. The system 802 comprises a processor 810 coupled to a memory 824 configured to store instructions. These instructions are loaded into the processor 810 and, when executed, cause the processor 810 to perform certain actions, e.g. steps in a process. The processor 810 is coupled to one or more sources 820 and to one or more detectors 822. In certain embodiments, the processor 810 performs one or more of the actions of activating the source 820, changing the type and/or timing of light emitted by the source 820, or changing the configuration of the source 820. In certain embodiments, the processor 810 performs one or more of the actions of activating the detector 822, changing the configuration of the detector 822, or receiving information from the detector 822 regarding the light sensed by the detector 822.

The processor 810 is coupled to one or more actuators 830 that are, in turn, coupled to a tray 832 that is not part of the system 800. In certain embodiments, there is a carrier or attachment mechanism (not shown in FIG. 8) between the actuator 830 and the tray 832. The processor 810 commands the actuator 830 to move the tray 832 in one or more axes. In certain embodiments, there is a position sensing element (not shown in FIG. 8), for example a linear position sensor, that senses the position of the tray 832 and provides this information to the processor 810.

This application includes description that is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. It is understood that the specific order or hierarchy of steps or blocks in the processes disclosed is an illustration of exemplary approaches. Based upon design preferences, it is understood that the specific order or hierarchy of steps or blocks in the processes may be rearranged. The accompanying method claims present elements of the various steps in a sample order, and are not meant to be limited to the specific order or hierarchy presented. Thus, the claims are not intended to be limited to the aspects shown herein, but is to be accorded the full scope consistent with the language claims.

Headings and subheadings, if any, are used for convenience only and do not limit the invention.

Reference to an element in the singular is not intended to mean "one and only one" unless specifically so stated, but rather "one or more." Use of the articles "a" and "an" is to be interpreted as equivalent to the phrase "at least one." Unless specifically stated otherwise, the terms "a set" and "some" refer to one or more.

Terms such as "top," "bottom," "upper," "lower," "left," "right," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference without limiting their orientation in other frames of reference.

Although the relationships among various components are described herein and/or are illustrated as being orthogonal or perpendicular, those components can be arranged in other configurations in some embodiments. For example, the angles formed between the referenced components can be greater or less than 90 degrees in some embodiments.

Although various components are illustrated as being flat and/or straight, those components can have other configurations, such as curved or tapered for example, in some embodiments.

Pronouns in the masculine (e.g., his) include the feminine and neuter gender (e.g., her and its) and vice versa. All structural and functional equivalents to the elements of the various aspects described throughout this disclosure that are known or later come to be known to those of ordinary skill in the art are expressly incorporated herein by reference and are intended to be encompassed by the claims.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such as an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

Although embodiments of the present disclosure have been described and illustrated in detail, it is to be clearly understood that the same is by way of illustration and example only and is not to be taken by way of limitation, the scope of the present invention being limited only by the terms of the appended claims.

We claim:

1. An apparatus for positioning a feature of a tray, comprising:
   a first source configured to emit a first type of light to illuminate a first region of a surface of the tray,
   a first detector coupled to the source and configured to sense the first type of light reflected from the surface of the tray and provide a first signal comprising information about the sensed first type of light,
   an actuator coupled to the source and to the tray and configured to cause the tray to move relative to the source upon receipt of a command,
   a processor coupled to the actuator and the detector and configured to receive the first signal and send the command, and
   a memory coupled to the processor and comprising instructions that, when executed on the processor, cause the processor to:
   evaluate a magnitude of the first type of sensed light,
   determine the location of the feature relative to a designated location based on the magnitude of the first type of sensed light, and
   cause the actuator to move the tray so as to move the feature toward the designated location.

2. The apparatus of claim 1, wherein the first type of light illuminating the first region has a spatial intensity that is not uniform over the first region.

3. The apparatus of claim 1, wherein the magnitude of the sensed first type of light is at a local minimum when the feature is at the designated location.

4. The apparatus of claim 1, wherein the magnitude of the sensed first type of light comprises a total energy of the sensed first type of light.

5. The apparatus of claim 1, wherein the designated location is within the first region.

6. The apparatus of claim 5, wherein the designated location is the center of the first region.

7. The apparatus of claim 1, wherein the detector has a field-of-view covering a second region of the surface of the tray.

8. The apparatus of claim 7, wherein the first region is contained within the second region.

9. The apparatus of claim 1, further comprising:
   a second source configured to emit a second type of light to illuminate a portion of the first region of the surface of the tray, and
   a second detector coupled to the first and second sources and configured to sense the second type of light reflected from the surface of the tray and provide a second signal comprising information about the sensed second type of light,
   wherein the processor is coupled to the second detector and further configured to:
   receive the second signal,
   evaluate a magnitude of the second type of sensed light, and
   determine the location of the feature relative to the designated location based on the magnitudes of the first and second types of sensed light.

10. A method for positioning a hole in a tray, comprising the steps of:
    illuminating a first region of a surface of the tray with light,
    sensing the light that is reflected from the surface,
    moving the tray until the hole enters the first region, whereupon a portion of the light passes into the hole and is not reflected,
    evaluating a total energy of the sensed light, and
    moving the tray based on the total energy of the sensed light until the total energy is at a minimum.

11. The method of claim 10, wherein a designated location is located at a center of the first region.

12. The method of claim 10, wherein the light illuminating the first region has a spatial intensity that is not uniform over the first region.

13. The method of claim 12, wherein the light illuminating the first region has a spatial intensity that is greater in the center than at the periphery.

14. The method of claim 10, wherein the designated location is at a center of the first region.

* * * * *